(12) United States Patent
Li et al.

(10) Patent No.: US 11,101,213 B2
(45) Date of Patent: Aug. 24, 2021

(54) EFUSE STRUCTURE WITH MULTIPLE LINKS

(71) Applicant: INTERNATIONAL BUSINESS MACHINES CORPORATION, Armonk, NY (US)

(72) Inventors: Baozhen Li, South Burlington, VT (US); Chih-Chao Yang, Glenmont, NY (US); Jim Shih-Chun Liang, Poughkeepsie, NY (US); Tian Shen, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/774,893

(22) Filed: Jan. 28, 2020

(65) Prior Publication Data

US 2021/0233844 A1    Jul. 29, 2021

(51) Int. Cl.
*H01L 23/525* (2006.01)
*H01L 23/522* (2006.01)
*H01L 23/528* (2006.01)

(52) U.S. Cl.
CPC ...... *H01L 23/5256* (2013.01); *H01L 23/5223* (2013.01); *H01L 23/5226* (2013.01); *H01L 23/5283* (2013.01)

(58) Field of Classification Search
CPC ............. H01L 23/5256; H01L 23/5223; H01L 23/5226; H01L 23/5283
USPC ......................................................... 257/529
See application file for complete search history.

(56) References Cited

U.S. PATENT DOCUMENTS

| | | |
|---|---|---|
| 7,304,366 B2 | 12/2007 | Wu et al. |
| 7,348,654 B2 | 3/2008 | Hsieh et al. |
| 8,421,186 B2 | 4/2013 | Li et al. |
| 8,674,476 B2 | 3/2014 | Basker et al. |
| 8,921,167 B2 | 12/2014 | Junjing |
| 9,324,655 B2 | 4/2016 | Bao et al. |
| 9,627,312 B2 | 4/2017 | Childs et al. |
| 10,014,252 B2 | 7/2018 | Chang et al. |
| 10,734,474 B2 * | 8/2020 | Huang ................ H01L 23/5226 |
| 2006/0022300 A1 | 2/2006 | Shieh-Yang |

* cited by examiner

*Primary Examiner* — Tu-Tu V Ho
(74) *Attorney, Agent, or Firm* — L. Jeffrey Kelly (57) ABSTRACT

An eFuse structure including a semiconductor substrate; back end of the line (BEOL) metallization levels on the semiconductor substrate; vias extending through the metallization levels; at least one of the metallization levels including one or more metallic plates in electrical contact with one of the vias, the one or more metallic plates having at least one fusible link in electrical contact with one or more additional vias. The eFuse structure may form a multi-fuse structure such that each fusible link may be fused separately or together at the same time.

20 Claims, 8 Drawing Sheets

EFUSE STRUCTURE WITH MULTIPLE LINKS

BACKGROUND

The present exemplary embodiments pertain to integrated circuit devices and, more particularly pertain to integrated circuit devices having an eFuse with multiple links that may be formed by a metal insulator metal capacitor (MIMCap) process.

EFuses, or simply fuses or fuse structures, are utilized within integrated circuit devices for a variety of purposes, such as programming certain functionality into the device or to enable or disable various devices within the circuit device. Such fuse structures can break electrical connections (such as in physically destroyable fuses or anti-fuses).

The eFuses are typically formed in the back end of the line (BEOL) layers of the integrated circuit device. The BEOL layers comprise multiple metallization layers on top of a semiconductor substrate. EFuses are typically single link or single switch devices wherein only one circuit element may be disabled when the eFuse is activated.

BRIEF SUMMARY

The various advantages and purposes of the exemplary embodiments as described above and hereafter are achieved by providing, according to an aspect of the exemplary embodiments, an eFuse structure comprising: a semiconductor substrate; a plurality of back end of the line (BEOL) metallization levels on the semiconductor substrate; a plurality of vias extending through the plurality of metallization levels; at least one of the metallization levels comprising one of more metallic plates in electrical contact with one of the plurality of vias, the one or more metallic plates having at least one fusible link in electrical contact with one or more additional vias, each of the one or more metallic plates having a width in a plane of the at least one of the metallization levels, $w_{MP}$, and each fusible link having a width in the plane of the at least one of the metallization levels, $w_{FL}$, such that $w_{MP} > w_{FL}$.

According to another aspect of the exemplary embodiments, there is provided a metal insulator metal capacitor (MIMcap) structure comprising: a semiconductor substrate; a plurality of back end of the line (BEOL) metallization levels on the semiconductor substrate; a plurality of MIMcaps in the BEOL metallization levels comprising first, second and third capacitor plates and a capacitor dielectric separating the first and second capacitor plates and separating the second and third capacitor plates; a via in the BEOL metallization levels between the plurality of MIMcaps; and a plurality of fusible links electrically contacting the via to one of the first, second and third capacitor plates in each of the plurality of MIMcaps such that, in operation, upon fusing one of the fusible links to form a fused link, the MIMcap electrically connected by the fused link is isolated from an integrated circuit.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A and 1B illustrate one exemplary embodiment of an eFuse according to the invention in which FIG. 1A is a cross sectional view of the eFuse and FIG. 1B is a topdown view in the direction of B-B in FIG. 1A.

FIGS. 2A and 2B illustrate one exemplary embodiment of an eFuse according to the invention in which FIG. 2A is a cross sectional view of the eFuse and FIG. 2B is a topdown view in the direction of B-B in FIG. 2A.

FIGS. 3A and 3B illustrate one exemplary embodiment of an eFuse according to the invention in which FIG. 3A is a cross sectional view of the eFuse and FIG. 3B is a topdown view in the direction of B-B in FIG. 3A.

FIGS. 4A and 4B illustrate one exemplary embodiment of an eFuse according to the invention in which FIG. 4A is a cross sectional view of the eFuse and FIG. 4B is a topdown view in the direction of B-B in FIG. 4A.

FIGS. 5A and 5B illustrate one exemplary embodiment of an eFuse to trim an MIMcap, to isolate a defective MIMcap or a multiple way switch according to the invention in which FIG. 5A is a cross sectional view of the eFuse and FIG. 5B is a topdown view in the direction of B-B in FIG. 5A.

FIGS. 6A to 6C illustrate one method of fabricating the eFuse of FIGS. 2A and 2B in which FIG. 6A illustrates deposition of contacts (metal wire below MIMcap), plates and dielectric and openings for vias, FIG. 6B illustrates filling the via openings with a conductive material and FIG. 6C illustrates deposition of a top layer of dielectric and additional contacts.

DETAILED DESCRIPTION

Efuses may be used for trimming capacitors and resistors as well as isolating defective capacitors or other circuit elements. In the exemplary embodiments, it is proposed to fabricate the eFuses by an MIMcap process. Multiple MIMcap plates may be used as fusing elements for multiple links and switches. By fabricating the eFuses by the MIMcap process, no additional mask and process steps are required. By having multiple links and switches, easy and efficient control of programming may be accomplished while conserving valuable real estate.

Using embodiments of the invention, an unplanned system failure may be changed to a planned system repair. By isolating the defective circuit element, such as a defective MIMcap, a "short" defect which is causing a system failure may be fixed. Though isolating the defective circuit element may result in some performance degradation in a given core or module, the system management may replace the degraded core with spare cores to save the chip (an electric short will kill a chip).

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc. The substrate can also comprise dielectric materials as described below. Further, active devices may be embedded in the substrate.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein, unless specified, can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, copper, ruthenium, rhodium, palladium, or nickel, or a metal silicide, any alloys of such metals, or their nitrides, such as titanium nitride and tantalum nitride, and may be deposited using physical vapor deposition, chemical vapor deposition, or any other technique known in the art.

When patterning any material herein, the material to be patterned can be grown or deposited in any known manner and a patterning layer (such as an organic photoresist, also known as a "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Referring now to the Figures in more detail, the "A" Figure of FIGS. 1A-5A is a cross-sectional view of the eFuse in the BEOL layers on a semiconductor substrate and the "B" Figure of FIGS. 1B-5B is a topdown view in the direction of B-B in the "A" Figure.

Figure 1A:
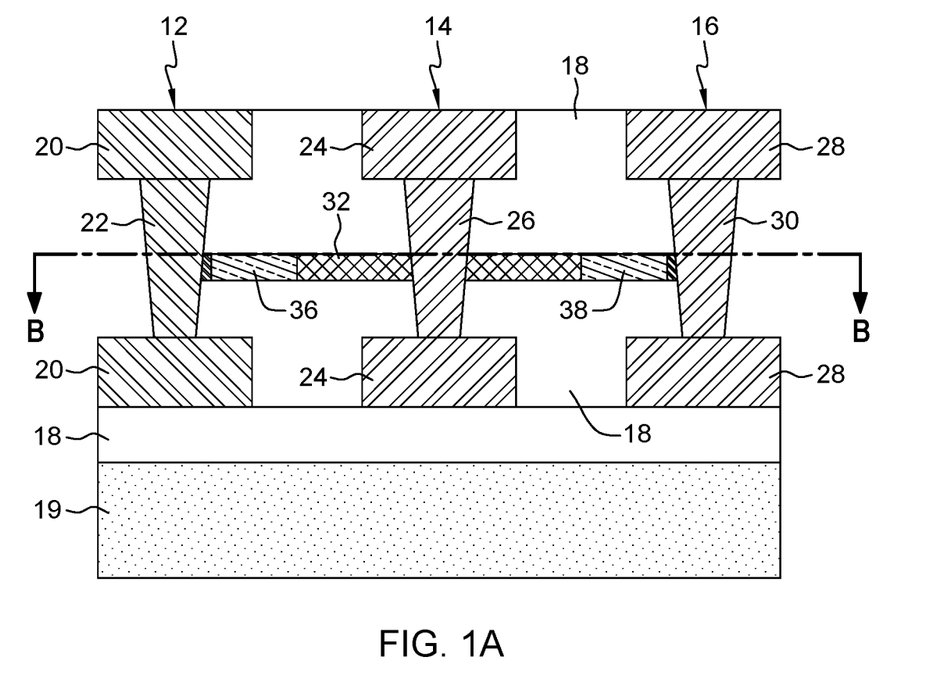

FIG. 1A illustrates a cross-sectional view of one exemplary embodiment of an eFuse. First contact structure 12, second contact structure 14 and third contact structure 16 are disposed in dielectric 18. In turn, dielectric 18 is disposed on semiconductor substrate 19. For ease of illustration, the dielectric 18 is depicted as a single layer, though one skilled in the art would understand that in many embodiments of the invention, several layers of dielectric would be used, possibly of different dielectrics. Each contact structure 12, 14, 16 comprises contacts and vias connecting the contacts. Thus, contact structure 12 comprises contacts 20 and connecting via 22; contact structure 14 comprises contacts 24 and connecting via 26; and contact structure 16 comprises contacts 28 and connecting via 30.

Figure 1B:
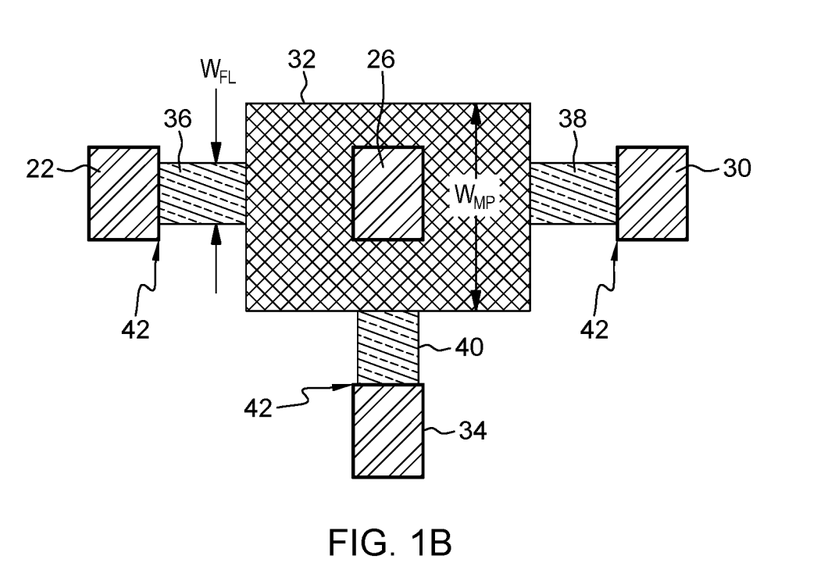

In the exemplary embodiment illustrated in FIG. 1A, a plate 32 is interposed between contacts 20, 24, 28 and in electrical contact with vias 22, 26, 30, 34. As shown in FIG. 1B, via 34 is directly in front of via 26 so via 34 is not shown in the cross-sectional view of FIG. 1A. The plate 32 may be approximately centered over via 26. The plate 32 is physically, as well as electrically, connected to vias 22, 30, 34 by fusible links 36, 38, 40, respectively. The fusible links 36, 38, 40 may be considered to be narrowed portions of the plate 32.

The plate 32 has a width, $W_{MP}$, and each of the fusible links 36, 38, 40, has a width, $W_{FL}$, such that $W_{MP}$ is greater than $W_{FL}$. The fusible links 36, 38, 40 should have a width less than that of the plate 32 so that the fusible links 36, 38, 40 have a higher current density when a predetermined current is applied, thereby causing the fusible links 36, 38, 40 to fuse or become disconnected. An advantage of the exemplary embodiment is that each link 36, 38, 40 may be fused separately or all together so that the structure essentially is a multi-fuse environment.

When the fusible links 36, 38, 40 fuse, they may fuse anywhere along their length between the large, central portion of the plate 32 and their respective via 22, 30, 34. However, it is likely that the fusible links 36, 38, 40 will fuse at the interface with their respective via 22, 30, 34 as indicated by arrows 42.

Figure 2A:
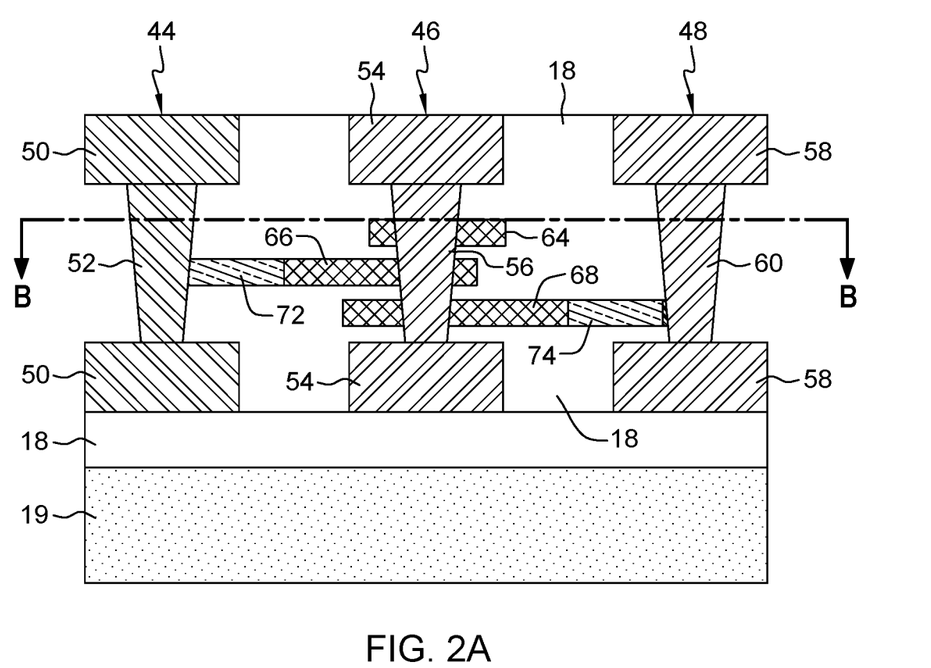

FIG. 2A illustrates a cross-sectional view of another exemplary embodiment of an eFuse. First contact structure 44, second contact structure 46 and third contact structure 48 are disposed in dielectric 18. In turn, dielectric 18 is disposed on semiconductor substrate 19. For ease of illustration, the dielectric 18 is depicted as a single layer, though one skilled in the art would understand that in many embodiments of the invention, several layers of dielectric would be used, possibly of different dielectrics. Each contact structure 44, 46, 48 comprises contacts and vias connecting the contacts. Thus, contact structure 44 comprises contacts 50 and connecting via 52; contact structure 46 comprises contacts 54 and connecting via 56 and contact structure 48 comprises contacts 58 and connecting via 60.

Figure 2B:
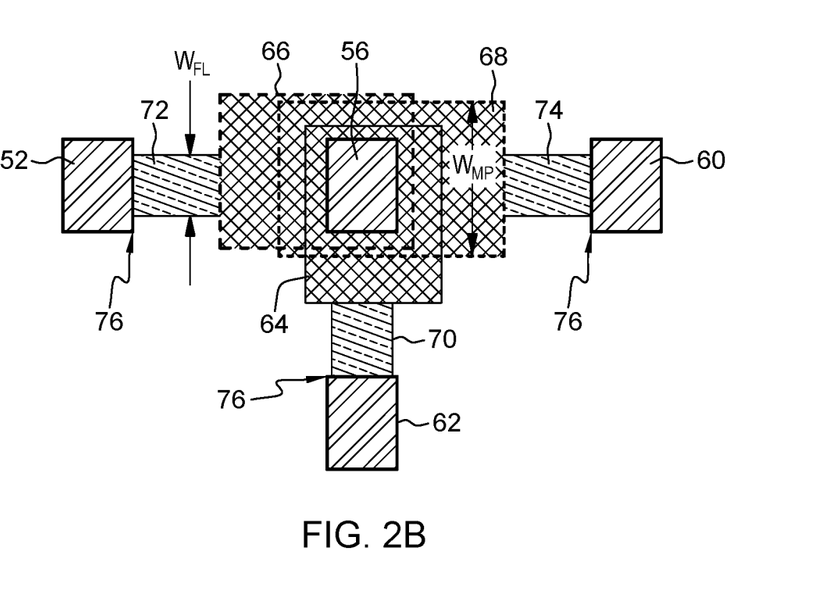

In the exemplary embodiment illustrated in FIG. 2A, multiple plates 64, 66, 68 are interposed between contacts 50, 54, 58. As shown in FIG. 2B, via 62 is directly in front of via 56 so via 62 is not shown in the cross-sectional view of FIG. 2A. Whereas in FIGS. 1A and 1B, plate 32 was in electrical contact with all vias 22, 26, 30, 34, the multiple plates 64, 66, 68 are in electrical contact with different vias. That is, plate 64 is in direct electrical contact with via 56 and in electrical contact with via 62 through fusible link 70, plate 66 is in direct electrical contact with via 56 and in electrical contact with via 52 through fusible link 72 and plate 68 is in direct electrical contact with via 56 and in electrical contact with via 60 through fusible link 74. The fusible links 70, 72, 74 may be considered to be narrowed portions of the plates 64, 66, 68, respectively.

Each of the plates 64, 66, 68 has a width, $W_{MP}$, and each of the fusible links 70, 72, 74 has a width, $W_{FL}$, such that $W_{MP}$ is greater than $W_{FL}$. $W_{MP}$ may be different for each plate 64, 66, 68. The fusible links 70, 72, 74 should have a width less than that of the plates 64, 66, 68, respectively, so that the fusible links 70, 72, 74 have a higher current density when a predetermined current is applied, thereby causing the fusible links 70, 72, 74 to fuse or become disconnected. An advantage of the exemplary embodiment is that each link 70, 72, 74 may be fused separately or all together so that the structure essentially is a multi-fuse environment.

When the fusible links 70, 72, 74 fuse, they may fuse anywhere along their length between the large, central portion of the plates 64, 66, 68 and their respective via 62, 52, 60. However, it is likely that the fusible links 70, 72, 74 will fuse at the interface with their respective via 62, 52, 60 as indicated by arrows 76.

Figure 3A:
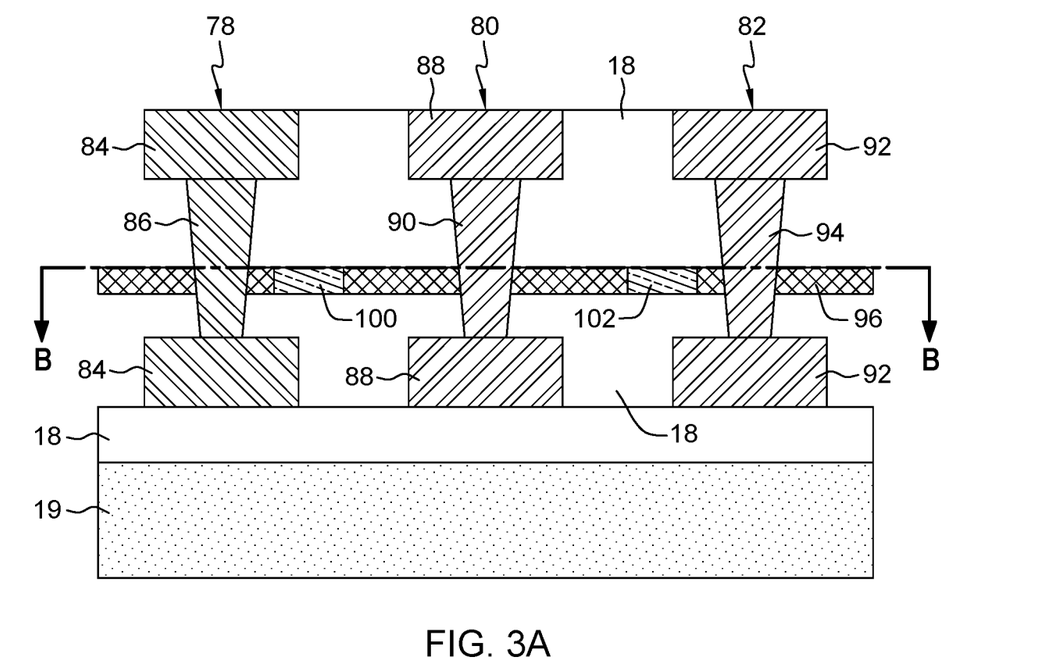

FIG. 3A illustrates a cross-sectional view of a further exemplary embodiment of an eFuse. First contact structure 78, second contact structure 80 and third contact structure 82 are disposed in dielectric 18. In turn, dielectric 18 is disposed on semiconductor substrate 19. For ease of illustration, the dielectric 18 is depicted as a single layer, though one skilled in the art would understand that in many embodiments of the invention, several layers of dielectric would be used, possibly of different dielectrics. Each contact structure 78, 80, 82 comprises contacts and vias connecting the contacts. Thus, contact structure 78 comprises contacts 84 and connecting via 86; contact structure 80 comprises contacts 88 and connecting via 90; and contact structure 82 comprises contacts 92 and connecting via 94.

Figure 3B:
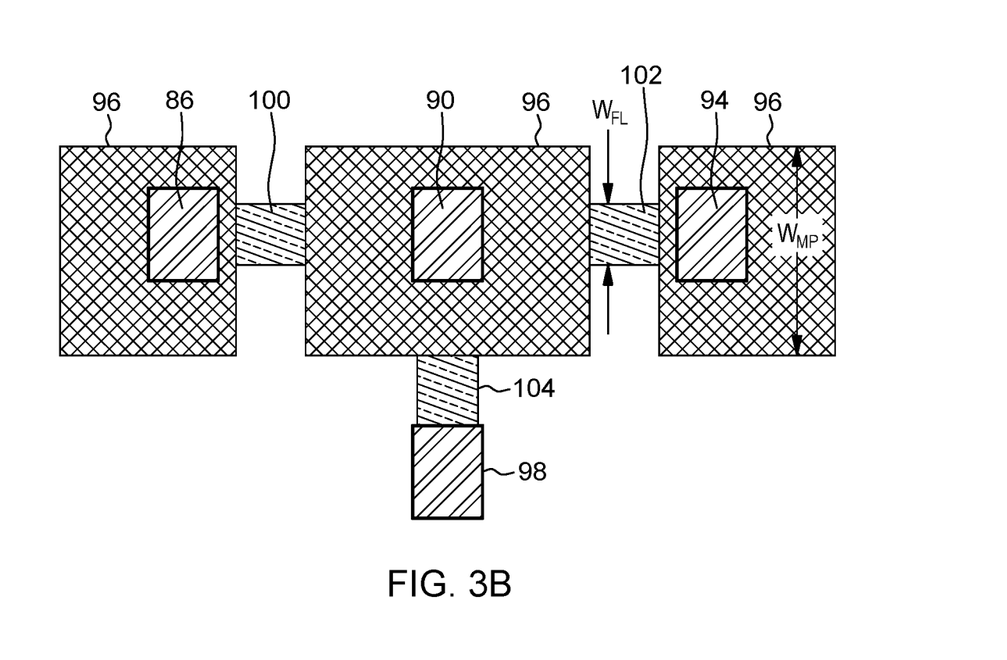

In the exemplary embodiment illustrated in FIG. 3A, a plate 96 is interposed between contacts 84, 88, 92 and in electrical contact with vias 86, 90, 94, 98. As shown in FIG. 3B, via 98 is directly in front of via 90 so via 98 is not shown in the cross-sectional view of FIG. 3A. The plate 96 may be positioned so that there is some area of the plate 96 in contact with vias 86, 90, 94, 98 on all sides. The plate 96 has narrowed portions between each pair of vias which form fusible links 100, 102, 104. That is, fusible link 100 is a narrowed portion in plate 96 between vias 86 and 90; fusible link 102 is a narrowed portion in plate 96 between vias 90 and 94; and fusible link 104 is a narrowed portion in plate 96 between vias 90 and 98.

The plate 96 has a width, $W_{MP}$, and each of the fusible links 100, 102, 104, has a width, $W_{FL}$, such that $W_{MP}$ is greater than $W_{FL}$. $W_{MP}$ may be different for each portion of the plate 96. The fusible links 100, 102, 104 should have a width less than that of the plate 96 so that the fusible links 100, 102, 104 have a higher current density when a predetermined current is applied, thereby causing the fusible links 100, 102, 104 to fuse or become disconnected. An advantage of the exemplary embodiment is that each link 100, 102, 104 may be fused separately or all together so that the structure essentially is a multi-fuse environment.

Figure 4A:
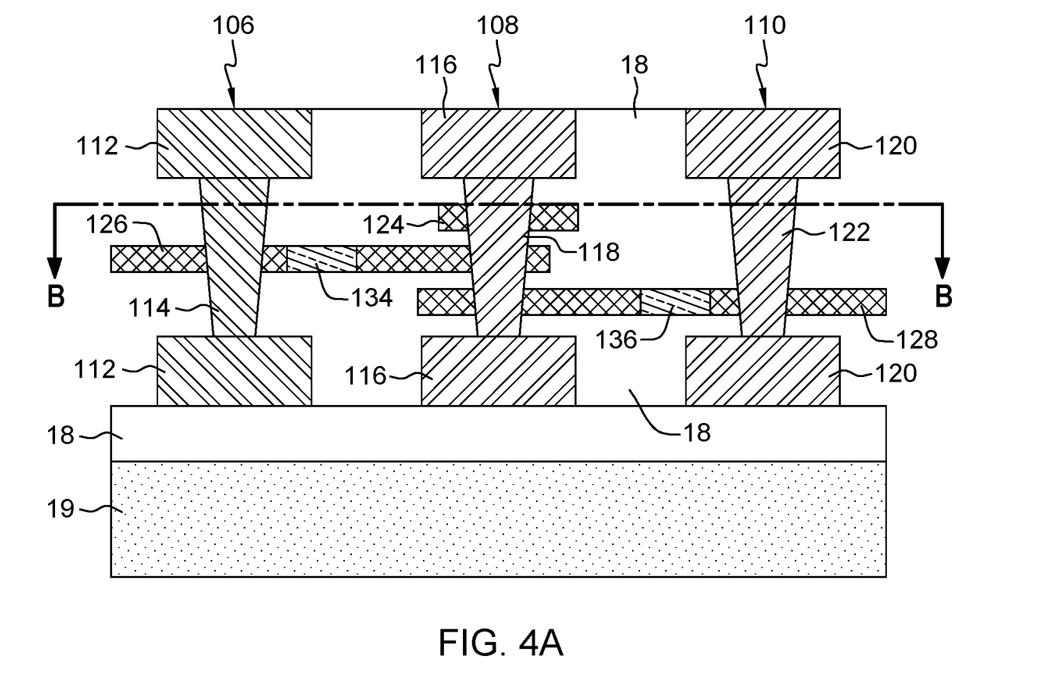

FIG. 4A illustrates a cross-sectional view of yet another exemplary embodiment of an eFuse. First contact structure 106, second contact structure 108 and third contact structure 110 are disposed in dielectric 18. In turn, dielectric 18 is disposed on semiconductor substrate 19. For ease of illustration, the dielectric 18 is depicted as a single layer, though one skilled in the art would understand that in many embodiments of the invention, several layers of dielectric would be used, possibly of different dielectrics. Each contact structure 106, 108, 110 comprises contacts and vias connecting the contacts. Thus, contact structure 106 comprises contacts 112 and connecting via 114; contact structure 108 comprises contacts 116 and connecting via 118; and contact structure 110 comprises contacts 120 and connecting via 122.

Figure 4B:
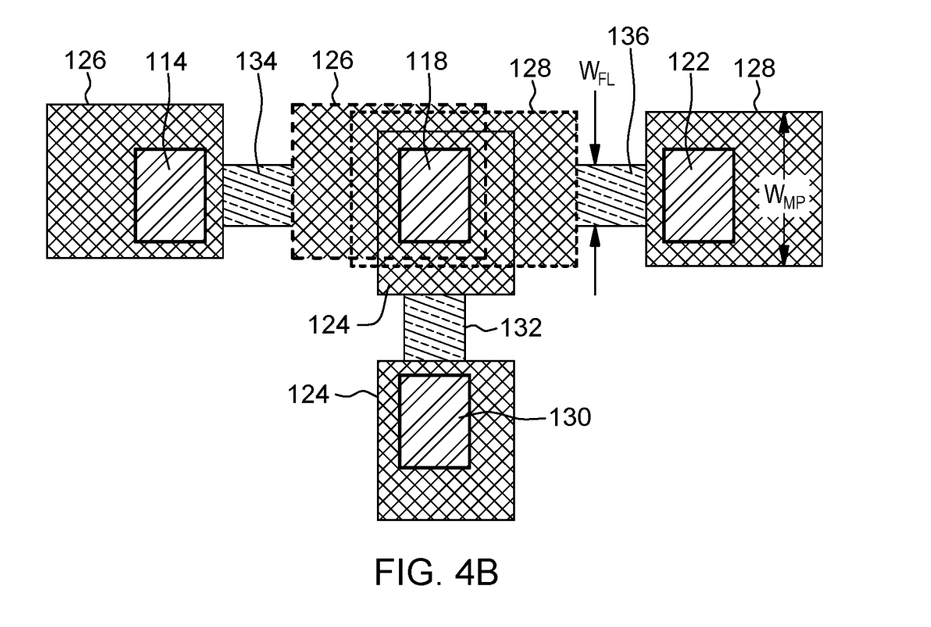

In the exemplary embodiment illustrated in FIG. 4A, multiple plates 124, 126, 128 are interposed between contacts 112, 116, 120. As shown in FIG. 4B, via 130 is directly in front of via 118 so via 130 is not shown in the cross-sectional view of FIG. 4A. Whereas in FIGS. 1A and 1B, plate 32 was in electrical contact with all vias 22, 26, 30, 34, the multiple plates 124, 126, 128 are in electrical contact with different vias. That is, plate 124 is in direct electrical contact with vias 118, 130; plate 126 is in direct electrical contact with vias 118, 114; and plate 128 is in direct electrical contact with vias 118, 122. The plates 124, 126, 128 may be positioned so that there is some area of each of the plates 124, 126, 128 in contact with vias 114, 118, 122, 130 on all sides.

Each of the plates 124, 126, 128 has narrowed portions between each pair of vias which form fusible links 132, 134, 136. That is, plate 124 has a narrowed portion between vias 118 and 130 to form fusible link 132; plate 126 has a narrowed portion between vias 118 and 114 to form fusible link 134; and plate 128 has a narrowed portion between vias 118 and 122 to form fusible link 136.

Each of the plates 124, 126, 128 has a width, $W_{MP}$ ($W_{MP}$ may be different for each plate), and each of the fusible links 132, 134, 136 has a width, $W_{FL}$, such that $W_{MP}$ is greater than $W_{FL}$. $W_{MP}$ may be different for each plate 124, 126, 128. The fusible links 132, 134, 136 should have a width less than that of the plates 124, 126, 128, respectively, so that the fusible links 132, 134, 136 have a higher current density when a predetermined current is applied, thereby causing the fusible links 132, 132, 136 to fuse or become disconnected. An advantage of the exemplary embodiment is that each link 132, 134, 136 may be fused separately or all together so that the structure essentially is a multi-fuse environment.

Figure 5A:
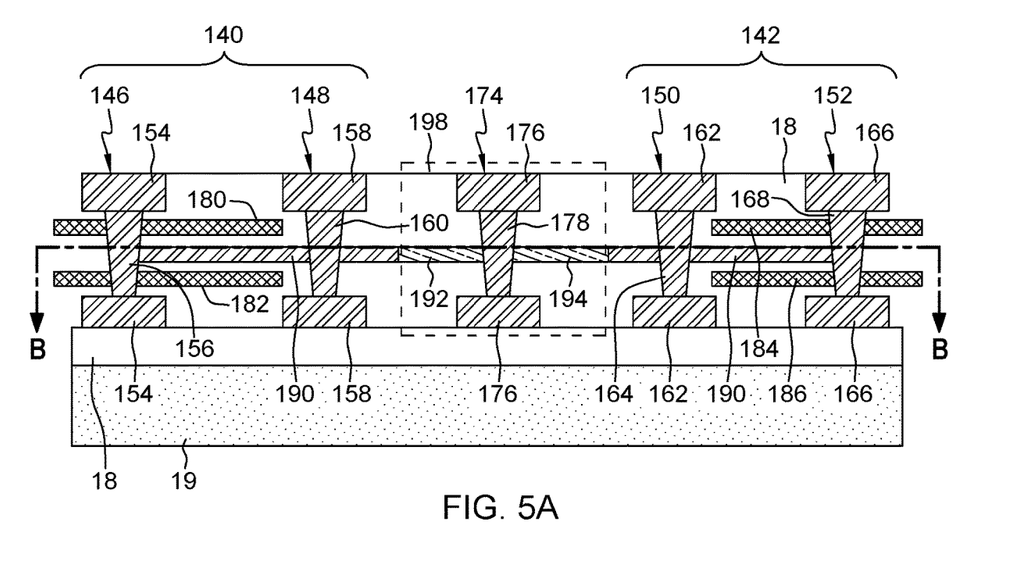

FIG. 5A illustrates a cross-sectional view of a further exemplary embodiment of an eFuse. In this exemplary embodiment, the eFuse may be used to trim an MIMcap, to isolate a defective MIMcap or as a multiple way switch.

Figure 5B:
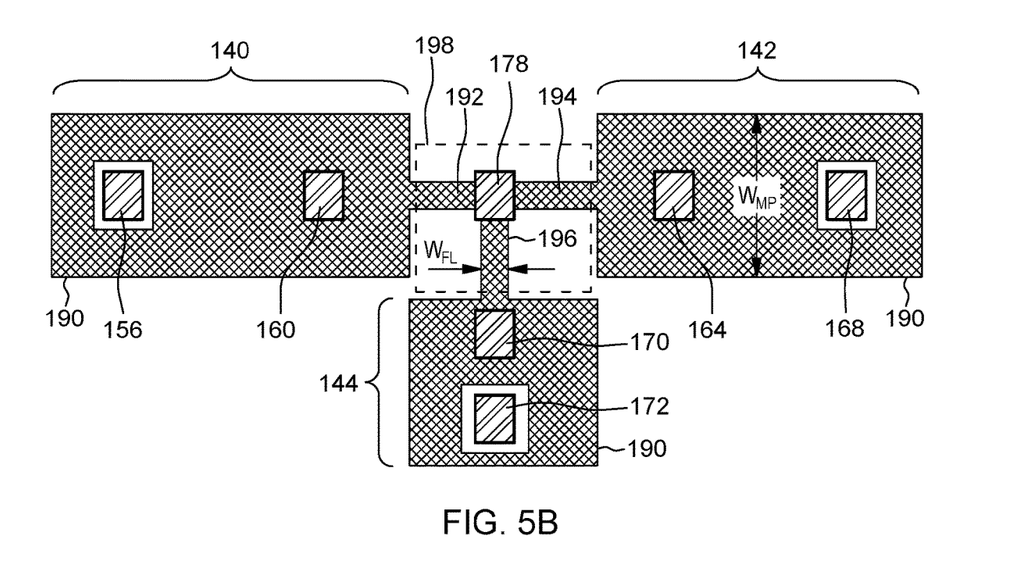

Illustrated are a first MIMcap 140, a second MIMcap 142 and a third MIMcap 144 (shown only in FIG. 5B). First MIMcap 140 includes contact structure 146 comprising contacts 154 and via 156 and contact structure 148 comprising contacts 158 and via 160. Second MIMcap 142 includes contact structure 150 comprising contacts 162 and via 164 and contact structure 152 comprising contacts 166 and via 168. A portion of third MIMcap 144 is shown in FIG. 5B illustrating vias 170, 172. Also illustrated is central contact structure 174 comprising contacts 176 and via 178.

In the exemplary embodiment illustrated in FIGS. 5A and 5B are capacitor plates interposed between the various contact structures. MIMcap 140 includes a top capacitor plate 180, a middle capacitor plate 190 and a bottom capacitor plate 182. Top capacitor plate 180 and bottom capacitor plate 182 are electrically connected to via 156 while middle capacitor plate 190 is only electrically connected to via 160. MIMcap 142 includes a top capacitor plate 184, a middle capacitor plate 190 and a bottom capacitor plate 186. Top capacitor plate 184 and bottom capacitor plate 186 are electrically connected to via 168 while middle capacitor plate 190 is only electrically connected to via 164. With respect to MIMcap 144, only middle capacitor plate 190 is electrically connected to via 170 as illustrated.

As is apparent, capacitor plate 190 is a single capacitor plate that extends to all MIMcaps 140, 142, 144. Capacitor plate 190 has narrowed portions 192, 194, 196 which form fusible links 192, 194, 196. The central contact structure 174 and fusible links 192, 194, 196 form the eFuse 198 of this exemplary embodiment. eFuse 198 is also denoted by dashed lines. The eFuse 198 may be enabled to, for example, isolate any of the MIMcaps 140, 142, 144 by fusing the respective link 192, 194, 196 connecting the targeted MIMcap to the central contact structure 174.

All of the MIMcaps 140, 142, 144 and central contact structure 174 are disposed in dielectric 18. In turn, dielectric 18 is disposed on semiconductor substrate 19. For ease of illustration, the dielectric 18 is depicted as a single layer, though one skilled in the art would understand that in many embodiments of the invention, several layers of dielectric would be used, possibly of different dielectrics. Note while most of the dielectric 18 may be low K dielectric materials, such as SiOC, SiCOH or $SiO_2$, high K dielectric layers, such as HfO2, Al2O3 may be sandwiched between the top plate and middle plate, and between the middle plate and the bottom plate to enhance the capacitance density of the MIMcaps.

The plate 190 has a width, $W_{MP}$ ($W_{MP}$ may be different for each plate), and each of the fusible links 192, 194, 196 has a width, $W_{FL}$, such that $W_{MP}$ is greater than $W_{FL}$. $W_{MP}$ may be different for each portion of the plate 190. The fusible links 192, 194, 196 should have a width less than that of the plate 190 so that the fusible links 192, 194, 196 have a higher current density when a predetermined current is applied, thereby causing the fusible links 192, 194, 196 to fuse or become disconnected. An advantage of the exemplary embodiment is that each link 192, 194, 196 may be fused separately or all together so that the structure essentially is a multi-fuse environment to isolate the MIMcaps 140, 142, 144 separately or all together.

In the exemplary embodiment illustrated in FIGS. 5A and 5B, the plate 190 is shorted only to vias 160, 164, 170 of MIMcaps 140, 142, 144, respectively, and to via 178 of the eFuse 198. Then, the eFuse 198 will operate by sending a predetermined current between the contact structure 178 and the via 160, 164 and/or 170 of the targeted MIMcap so as to fuse the fusible link 192, 194 and/or 196.

Alternatively, although more complicated, the eFuse 198 may operate by using the first and third capacitor plates (for example capacitor plates 180, 182 of MIMcap 140, capacitor plates 184, 186 of MIMcap 142 and similar capacitor plates of MIMcap 144 (not shown) of MIMcaps 140, 142, 144. In this case, since the first and third capacitor plates are both shorted only to vias 156, 168, 172, both of the first and third capacitor plates would also have to be shorted with via 178 of the eFuse 198 in order for the eFuse 198 to properly function.

The contact structures in any of the above exemplary embodiments may be comprised of conductive materials e.g., metals such as copper or aluminum, although other conductive materials such as other metals and metal alloys can be used. For the dielectric 18 in the above exemplary embodiments, low k dielectric materials, such and SiC, SiCOH or SiO2 may be used as between metal insulation (ILD), and a high-k dielectric such as HfO2, Al2O3, Ta2O5, or combination of high-k dielectrics, may be used for MIMcaps although other dielectrics are known to those skilled in the art. The dielectric layers between the plates may have a thickness from 1 nm to 10 nm, although other thicknesses are contemplated within the scope of the exemplary embodiments.

The plates in any of the exemplary embodiments, including the capacitor plates in FIGS. 5A and 5B, may be made of a conductive material such as titanium nitride (TiN), titanium, tantalum, tantalum nitride (TaN) or copper. The plate material layers may have a thickness from 10 nm to 200 nm, although other thicknesses may be contemplated within the scope of the exemplary embodiments.

Each of the above exemplary embodiments show three eFuses. It should be understood that it is within the scope of the exemplary embodiments to modify the exemplary embodiments to have two eFuses or even four or more eFuses.

Figure 6A:
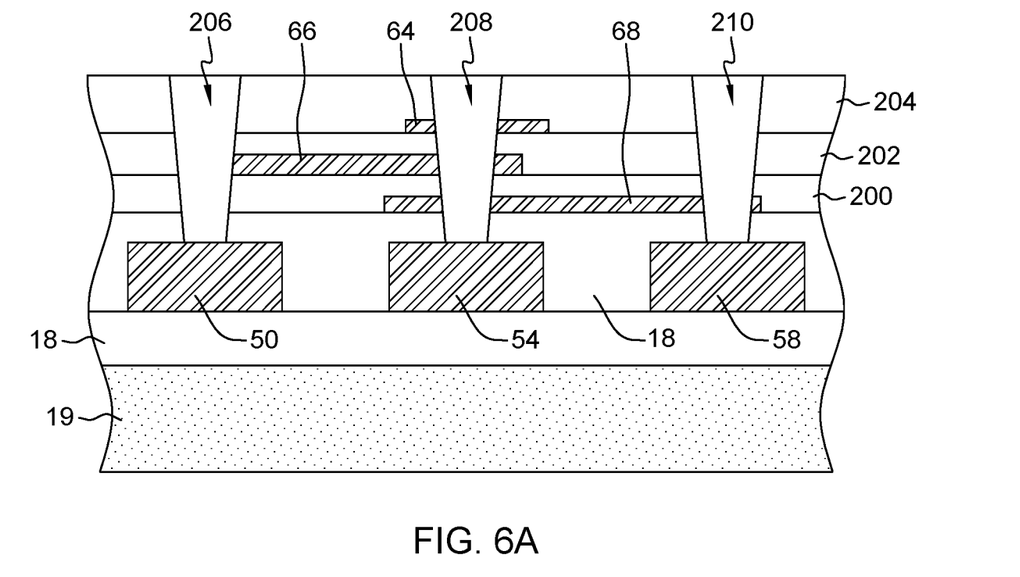
Figure 6B:
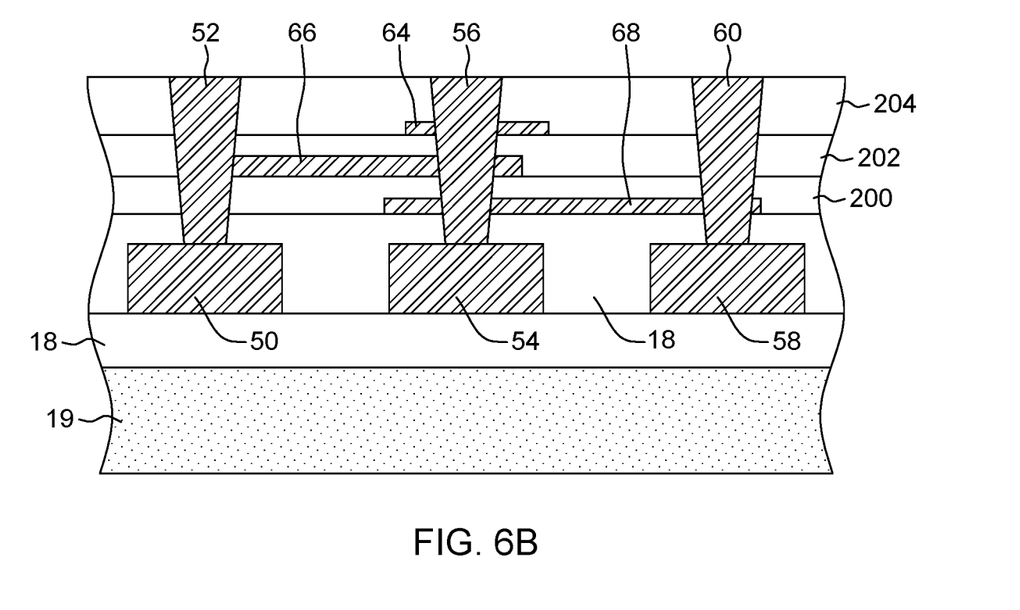
Figure 6C:
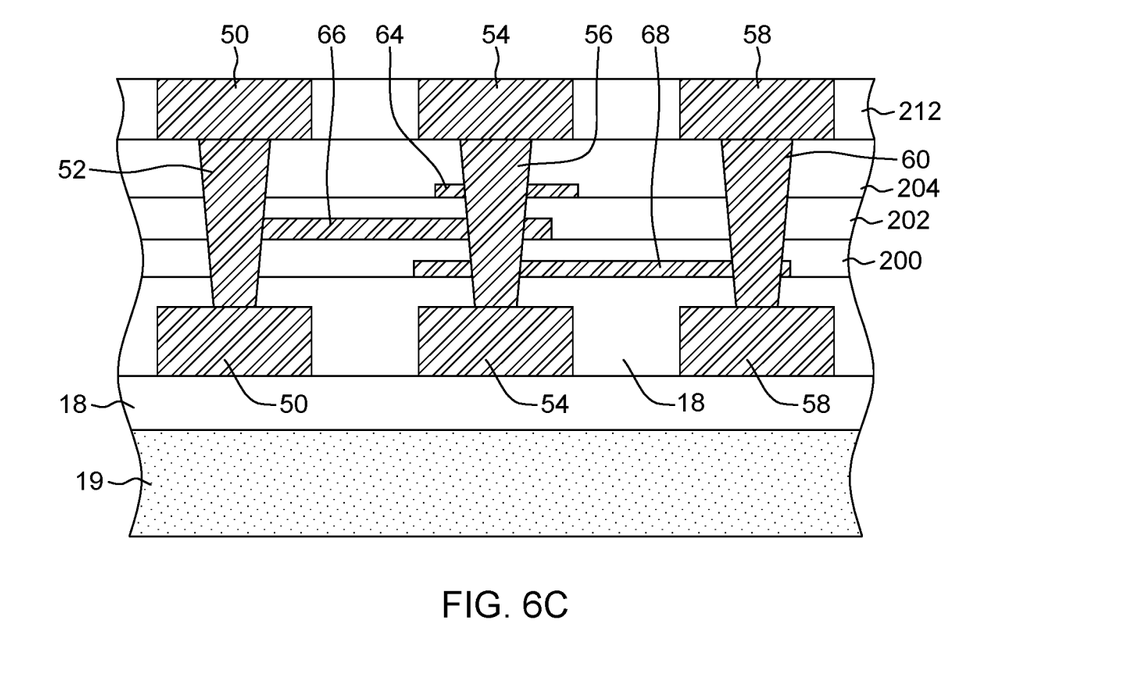

FIGS. 6A to 6C illustrate a process for forming the exemplary embodiments. For purposes of illustration and not limitation, FIGS. 6A to 6C specifically pertain to fabricating the exemplary embodiment of FIGS. 2A and 2B but it should be understood that the illustrated processes apply to all of the exemplary embodiments.

FIG. 6A is a cross-sectional diagram shows an intermediate process step as the vias are being fabricated.

To fabricate the structure, first the dielectric 18 and contacts 50, 54, 58 are deposited over substrate 19. Conventional deposition processes such as atomic layer deposition (ALD), chemical vapor deposition (CVD), plasma enhanced chemical vapor deposition (PECVD), electroless plating are used to deposit the dielectrics in respective embodiments. As is mentioned above, the dielectric 18 may be silicon dioxide. The details of the substrate which comprises, for example, a semiconductor structure with embedded devices, for example, transistors, capacitors and/or diodes as well as other interconnecting metallurgy are not shown for ease of illustration.

Next, a series of metal deposition, patterning and dielectric deposition steps take place to define the plates 62, 64, 66 and the dielectric layers 200, 202, 204. That is, first a metal layer is formed for bottom plate 66 using a deposition process, e.g., ALD, CVD, PECVD, PVD or sputtering. Then, the bottom plate 66 is patterned by lithography and etching to define its boundaries and to provide openings for the via recesses 206, 208, 210. Then, a conventional deposition step is used to deposit high-K dielectric layer 200. The metal deposition, patterning and dielectric deposition steps are repeated for middle plate 64, high-K dielectric layer 202, top plate 62 and dielectric layer 204. The narrowed portions 70, 72, 74 of the plates 64, 66, 68 are not shown for clarity.

Next, the via recesses 206, 208, 210 are formed using lithography and etching.

In FIG. 6B, a suitable deposition process is used to deposit a conductive material, usually a metal such as copper, in the via openings 206, 208, 2210 to form vias 52, 56, 60.

In FIG. 6C, a dielectric layer 212 is deposited, patterned and etched to produce contact recesses in which the contacts 50, 54, 58 are formed. The contacts each make electrical contact with a respective one of the vias 52, 56, 60.

Figure 7:
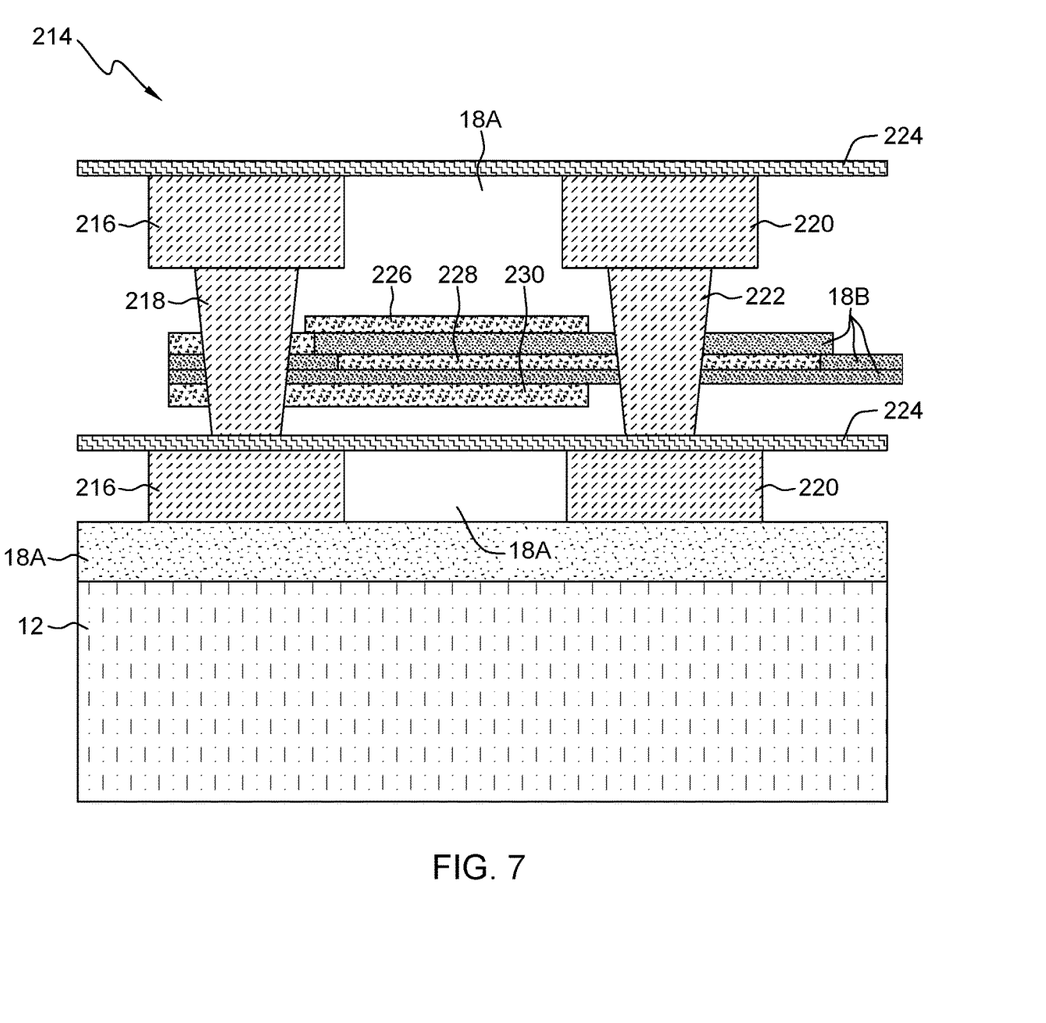
FIG. 7 is a cross-sectional view of an exemplary embodiment of the invention which shows that the plates may be conformal to the topography of the prior layers.

For the purpose of illustration and not limitation, FIG. 7 shows a cross-sectional diagram of an exemplary embodiment of an MIMcap 214 which shows that the plates may be conformal to the topography of prior layers. That is, the plates are not completely parallel over their full extent as depicted in the simplified drawings of the previous exemplary embodiments. However, large portions of the plate area are parallel and this depiction of the MIMcap 214 is exaggerated with respect to the amount of topography over the extent of the capacitor plate areas. It should be understood that in any of the previous embodiments, the various plates illustrated may be overlapping to a smaller or larger extent than those shown in FIG. 7.

In FIG. 7, one contact structure comprises contacts 216 and connecting via 218 while another contact structure shows contacts 220 and connecting via 222. There may also be an upper and lower capping layer 224, such as silicon nitride or silicon carbon nitride.

Among the dielectric in the MIMcap 214, there may be low k dielectric 18A on the substrate 12 and between the contacts 216, 220. There may also be high k dielectric 18B between the plates 226, 228, 230.

Upper plate 226 and lower plate 230 may be in electrical contact with via 218 while middle plate 228 may be in electrical contact with via 222.

The resulting structures can be included within integrated circuit chips, which can be distributed by the fabricator in raw wafer form (that is, as a single wafer that has multiple unpackaged chips), as a bare die, or in a packaged form. The end product can be any product that includes integrated circuit chips, ranging from toys and other low-end applications to advanced computer products having a display, a keyboard or other input device, and a central processor.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An eFuse structure comprising:
   a semiconductor substrate;
   a plurality of back end of the line (BEOL) metallization levels on the semiconductor substrate;
   a plurality of vias extending through the plurality of metallization levels;
   at least one of the metallization levels comprising one of more metallic plates in electrical contact with one of the plurality of vias, the one or more metallic plates having at least one fusible link in electrical contact with one or more additional vias, each of the one or more metallic plates having a width in a plane of the at least one of the metallization levels, $w_{MP}$, and each fusible link having a width in the plane of the at least one of the metallization levels, $w_{FL}$, such that $w_{MP} > w_{FL}$.

2. The eFuse structure of claim 1 wherein there is one metallization level comprising one metallic plate having fusible links in electrical contact with at least two additional vias.

3. The eFuse structure of claim 2 wherein, in operation, at least one fusible link fuses at the interface between the at least one fusible link and the additional via with which the fusible link is in electrical contact.

4. The eFuse structure of claim 3 wherein each fusible link may be fused separately or together with at least one other fusible link.

5. The eFuse structure of claim 2 further comprising an additional metallic plate at each of the at least two additional vias such that each fusible link is in direct physical contact with an additional metallic plate.

6. The eFuse structure of claim 5 wherein the at least two additional vias are surrounded on all sides by the additional metallic plate.

7. The eFuse structure of claim 5 wherein, in operation, at least one fusible link fuses between the one metallic plate and the additional metallic plate with which the fusible link is in electrical contact.

8. The eFuse structure of claim 7 wherein each fusible link may be fused separately or together with at least one other fusible link.

9. The eFuse structure of claim 1 wherein there are at least two metallization levels with each metallization level comprising one metallic plate having a fusible link in electrical contact with one additional via.

10. The eFuse structure of claim 9 wherein, in operation, at least one fusible link fuses at the interface between the at least one fusible link and the one additional one via with which the fusible link is in electrical contact.

11. The eFuse structure of claim 10 wherein each fusible link may be fused separately or together with at least one other fusible link.

12. The eFuse structure of claim 9 further comprising an additional metallic plate at the one additional via of the at least two metallization levels such that each fusible link is in direct physical contact with the additional metallic plate.

13. The eFuse structure of claim 12 wherein, in operation, at least one fusible link fuses between the one metallic plate and the additional metallic plate with which the fusible link is in electrical contact.

14. The eFuse structure of claim 12 wherein the one additional via of the at least two metallization levels are surrounded on all sides by the additional metallic plate.

15. A metal insulator metal capacitor (MIMcap) structure comprising:
    a semiconductor substrate;
    a plurality of back end of the line (BEOL) metallization levels on the semiconductor substrate;
    a plurality of MIMcaps in the BEOL metallization levels comprising first, second and third capacitor plates and a capacitor dielectric separating the first and second capacitor plates and separating the second and third capacitor plates;
    a via in the BEOL metallization levels between the plurality of MIMcaps; and
    a plurality of fusible links electrically contacting the via to one of the first, second and third capacitor plates in each of the plurality of MIMcaps such that, in operation, upon fusing one of the fusible links to form a fused link, the MIMcap electrically connected by the fused link is isolated from an integrated circuit.

16. The MIMcap structure of claim 15 wherein there are at least two MIMcaps and at least two fusible links connecting the via to each of the MIMcaps.

17. The MIMcap structure of claim 15 wherein the fusible links connect to the same capacitor plate of the first, second and third capacitor plates in each of the plurality of MIMcaps.

18. The MIMcap structure of claim 17 wherein the fusible links connect only to the second capacitor plate in each of the plurality of MIMcaps.

19. The MIMcap structure of claim 17 wherein the fusible links connect only to the first and third capacitor plates in each of the plurality of MIMcaps.

20. The MIMcap structure of claim 15 wherein each fusible link of the plurality of fusible links may be fused separately or together at the same time with at least one other fusible link.

* * * * *